(12) United States Patent
Poelzl et al.

(10) Patent No.: US 11,031,466 B2
(45) Date of Patent: Jun. 8, 2021

(54) METHOD OF FORMING OXYGEN INSERTED SI-LAYERS IN POWER SEMICONDUCTOR DEVICES

(71) Applicant: Infineon Technologies Austria AG, Villach (AT)

(72) Inventors: Martin Poelzl, Ossiach (AT); Robert Haase, San Pedro, CA (US); Maximilian Roesch, St. Magdalen (AT); Sylvain Leomant, Poertschach am Woerthersee (AT); Andreas Meiser, Sauerlach (DE); Bernhard Goller, Villach (AT); Ravi Keshav Joshi, Klagenfurt (AT)

(73) Assignees: Infineon Technologies Austria AG, Villach (AT); Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 16/896,593

(22) Filed: Jun. 9, 2020

(65) Prior Publication Data

US 2020/0303498 A1    Sep. 24, 2020

Related U.S. Application Data

(62) Division of application No. 16/058,593, filed on Aug. 8, 2018, now Pat. No. 10,741,638.

(51) Int. Cl.
*H01L 29/06* (2006.01)
*H01L 21/02* (2006.01)
(Continued)

(52) U.S. Cl.
CPC .... *H01L 29/0649* (2013.01); *H01L 21/02532* (2013.01); *H01L 21/02584* (2013.01);
(Continued)

(58) Field of Classification Search
CPC .................................................. H01L 29/0649
See application file for complete search history.

(56) References Cited

U.S. PATENT DOCUMENTS

| 6,404,007 B1 | 6/2002 | Mo et al. |
| 7,858,478 B2 | 12/2010 | Hirler |

(Continued)

FOREIGN PATENT DOCUMENTS

| DE | 102006002903 A1 | 8/2007 |
| DE | 102007044414 A1 | 3/2009 |
| WO | 2009079465 A1 | 6/2009 |

OTHER PUBLICATIONS

Datta, Suman, "Mitigation of Intrinsic Vt Variation using Oxygen Inserted (OI) Silicon Channel", University of Notre Dame, IEEE IEDM conference in San Francisco, CA, USA, Dec. 2017, accessed online at http://blog.atomera.com/wp-content/uploads/2017/12/2017-IEDM-Seminar-Suman-20171204.pdf on Aug. 8, 2018.

(Continued)

*Primary Examiner* — Walter H Swanson
(74) *Attorney, Agent, or Firm* — Murphy, Bilak & Homiller, PLLC

(57) ABSTRACT

A method of manufacturing a semiconductor device includes: forming one or more device epitaxial layers over a main surface of a doped Si base substrate; forming a diffusion barrier structure including alternating layers of Si and oxygen-doped Si in an upper part of the doped Si base substrate adjacent the main surface of the doped Si base substrate, in a lower part of the one or more device epitaxial layers adjacent the main surface of the doped Si base substrate, or in one or more additional epitaxial layers disposed between the main surface of the doped Si base substrate and the one or more device epitaxial layers; and forming a gate above the diffusion barrier structure.

20 Claims, 13 Drawing Sheets

(51) Int. Cl.
*H01L 21/225* (2006.01)
*H01L 27/06* (2006.01)
*H01L 29/10* (2006.01)
*H01L 29/40* (2006.01)
*H01L 29/417* (2006.01)
*H01L 29/66* (2006.01)
*H01L 29/78* (2006.01)
*H01L 29/739* (2006.01)

(52) U.S. Cl.
CPC ...... *H01L 21/2253* (2013.01); *H01L 27/0629* (2013.01); *H01L 29/1095* (2013.01); *H01L 29/407* (2013.01); *H01L 29/41741* (2013.01); *H01L 29/66553* (2013.01); *H01L 29/66727* (2013.01); *H01L 29/66734* (2013.01); *H01L 29/7813* (2013.01); *H01L 29/7391* (2013.01)

(56) References Cited

U.S. PATENT DOCUMENTS

| | | | |
|---|---|---|---|
| 8,067,800 | B2 | 11/2011 | Hsieh |
| 10,510,836 | B1 | 12/2019 | Haase et al. |
| 10,573,742 | B1 | 2/2020 | Feil et al. |
| 10,580,888 | B1 | 3/2020 | Blank et al. |
| 2004/0031987 | A1 | 2/2004 | Henninger et al. |
| 2004/0166636 | A1 | 8/2004 | Darwish |
| 2005/0167742 | A1 | 8/2005 | Challa et al. |
| 2007/0249142 | A1 | 10/2007 | Hisanaga |
| 2012/0061754 | A1 | 3/2012 | Hsieh |
| 2012/0064684 | A1 | 3/2012 | Hsieh |
| 2012/0074489 | A1 | 3/2012 | Hsieh |
| 2012/0187477 | A1 | 7/2012 | Hsieh |
| 2012/0280293 | A1 | 11/2012 | Pan |
| 2013/0168760 | A1 | 7/2013 | Hsieh |
| 2013/0313632 | A1 | 11/2013 | Schulze et al. |
| 2015/0270378 | A1 | 9/2015 | Konishi et al. |
| 2016/0300908 | A1* | 10/2016 | Heo .......... H01L 29/42384 |
| 2017/0263720 | A1 | 9/2017 | Hirler et al. |

OTHER PUBLICATIONS

Havanur, Sanjay, et al., "Power MOSFET Basics Understanding Superjunction Technology", Vishay Siliconix, Device Application Note AN849, accessed online at https://www.vishay.com/docs/66864/an849.pdf on Jul. 2, 2019, pp. 1-5.

Shao, Lin, et al., "Boron diffusion in silicon: the anomalies and control by point defect engineering", Reports: A Review Journal, Materials Science and Engineering R 42, Aug. 11, 2003, 65-114.

Takeuchi, Hideki, et al., "Punch-Through Stop Doping Profile Control via Interstitial Trapping by Oxygen-Insertion Silicon Channel", 2017 IEEE Electron Devices Technology and Manufacturing Conference (EDTM), Feb. 28-Mar. 2, 2017, pp. 1-6.

Xu, Nuo, et al., "Extension of Planar Bulk n-Channel MOSFET Scaling With Oxygen Insertion Technology", IEEE Transactions on Electron Devices, vol. 61, No. 9, Sep. 2014, pp. 3345-3349.

Xu, N., et al., "MOSFET Performance and Scalability Enhancement by Insertion of Oxygen Layers", 2012 International Electron Devices Meeting, San Francisco, CA, USA, Dec. 2012.

* cited by examiner

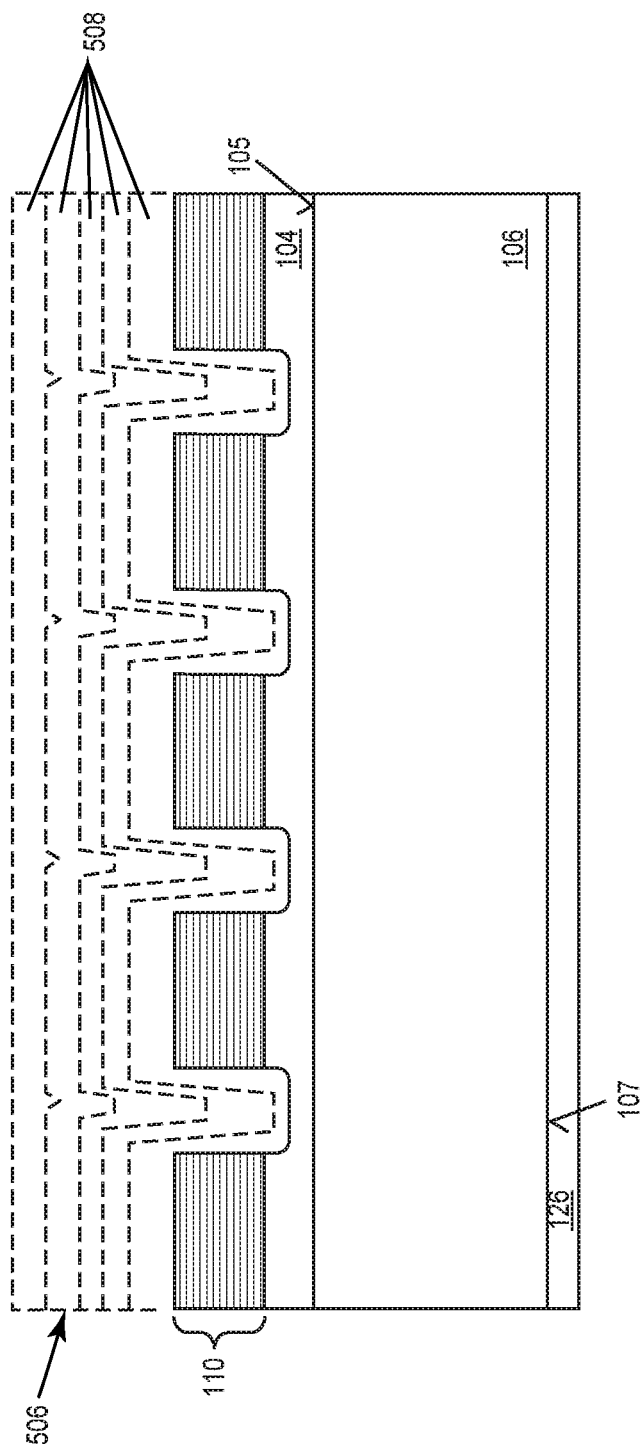

METHOD OF FORMING OXYGEN INSERTED SI-LAYERS IN POWER SEMICONDUCTOR DEVICES

BACKGROUND

Power semiconductor devices typically include highly doped Si substrates. Dopants out-diffuse from highly doped Si substrates due to high temperature, especially during epitaxial layer growth and high temperature oxidations/anneals. Si substrates highly doped with arsenic, phosphorous or boron, which are widely used in many types of low-voltage semiconductor transistor devices, are particularly susceptible to an out-diffusion tail which contributes significantly to RonA/FOMg (on-state resistance/Figure or Merit) loss of the device.

Hence, improved structures and manufacturing methods are needed to better dopant out-diffusion from highly doped Si substrates of power semiconductor devices.

SUMMARY

According to an embodiment of a semiconductor device, the semiconductor device comprises: a doped Si base substrate; one or more device epitaxial layers formed over a main surface of the doped Si base substrate; a diffusion barrier structure comprising alternating layers of Si and oxygen-doped Si formed in an upper part of the doped Si base substrate adjacent the main surface of the doped Si base substrate, in a lower part of the one or more device epitaxial layers adjacent the main surface of the doped Si base substrate, or in one or more additional epitaxial layers disposed between the main surface of the doped Si base substrate and the one or more device epitaxial layers; and a gate formed above the diffusion barrier structure. The gate may be disposed in a gate trench formed above the diffusion barrier structure in the one or more device epitaxial layers and extend in a direction toward the main surface of the doped Si base substrate. The gate instead may be a planar gate insulated from a main surface of the one or more device epitaxial layers by a gate dielectric.

In an embodiment, the diffusion barrier structure may have one or more gaps.

Separately or in combination, the diffusion barrier structure may be formed at an angle with respect to the main surface of the doped Si base substrate.

Separately or in combination, the semiconductor device may further comprise an additional diffusion barrier structure formed in the one or more device epitaxial layers and vertically spaced apart from the diffusion barrier structure, the additional diffusion barrier structure comprising alternating layers of Si and oxygen-doped Si.

Separately or in combination, the additional diffusion barrier structure may abut a sidewall of the gate trench.

Separately or in combination, the gate may be disposed in a gate trench formed above the diffusion barrier structure in the one or more device epitaxial layers and extending in a direction toward the main surface of the doped Si base substrate, and the additional diffusion barrier structure may have a gap along a lower part of the gate trench which contains a field electrode.

Separately or in combination, the diffusion barrier structure and the additional diffusion barrier structure may each have one or more gaps.

Separately or in combination, the semiconductor device may further comprise: a drift zone formed in the one or more device epitaxial layers; a body region above the drift zone and including a channel region; and a contact trench filled with an electrically conductive material which contacts the source region at a sidewall of the contact trench and a highly doped body contact region at a bottom of the contact trench, wherein the diffusion barrier structure may have a gap in the drift zone.

Separately or in combination, the semiconductor device may further comprise an additional diffusion barrier structure formed in the one or more device epitaxial layers and vertically spaced apart from the diffusion barrier structure, the additional diffusion barrier structure comprising alternating layers of Si and oxygen-doped Si, wherein the gate is a planar gate insulated from a main surface of the one or more device epitaxial layers by a gate dielectric, and wherein the additional diffusion barrier structure may have a gap along a lower part of the gate trench.

Separately or in combination, the additional diffusion barrier structure may terminate before reaching the highly doped body contact region.

Separately or in combination, a MOS-gated diode region and a FET region may be formed adjacent one another in the one or more device epitaxial layers.

Separately or in combination, the diffusion barrier structure may be limited to the MOS-gated diode region.

According to an embodiment of a method of manufacturing a semiconductor device, the method comprises: forming one or more device epitaxial layers over a main surface of a doped Si base substrate; forming a diffusion barrier structure comprising alternating layers of Si and oxygen-doped Si in an upper part of the doped Si base substrate adjacent the main surface of the doped Si base substrate, in a lower part of the one or more device epitaxial layers adjacent the main surface of the doped Si base substrate, or in one or more additional epitaxial layers disposed between the main surface of the doped Si base substrate and the one or more device epitaxial layers; and forming a gate above the diffusion barrier structure.

In an embodiment, forming the diffusion barrier structure may comprise forming the alternating layers of Si and oxygen-doped Si in the upper part of the doped Si base substrate adjacent the main surface of the doped Si base substrate.

Separately or in combination, forming the diffusion barrier structure may comprise forming the alternating layers of Si and oxygen-doped Si in the lower part of the one or more device epitaxial layers adjacent the main surface of the doped Si base substrate.

Separately or in combination, forming the diffusion barrier structure may comprise forming the alternating layers of Si and oxygen-doped Si in the one or more additional epitaxial layers disposed between the main surface of the doped Si base substrate and the one or more device epitaxial layers.

Separately or in combination, the method may further comprise forming one or more gaps in the diffusion barrier structure.

Separately or in combination, forming the one or more gaps in the diffusion barrier structure may comprise: forming a mask with one or more openings on the diffusion barrier structure; and etching the one or more gaps into the diffusion barrier structure through the one or more openings in the mask.

Separately or in combination, the method may further comprise forming an additional diffusion barrier structure in the one or more device epitaxial layers and vertically spaced apart from the diffusion barrier structure, the additional diffusion barrier structure comprising alternating layers of Si and oxygen-doped Si.

Separately or in combination, the method may further comprise forming one or more gaps in the diffusion barrier structure and the additional diffusion barrier structure.

Separately or in combination, the method may further comprise: forming a drift zone formed in the one or more device epitaxial layers; forming a body region in the one or more device epitaxial layers above the drift zone and including a channel region; forming a source region in the one or more device epitaxial layers above the body region; and forming a contact trench in the one or more device epitaxial layers, the contact trench being filled with an electrically conductive material which contacts the source region at a sidewall of the contact trench and a highly doped body contact region at a bottom of the contact trench, wherein the diffusion barrier structure may have a gap in the drift zone.

Separately or in combination, the method may further comprise forming an additional diffusion barrier structure in the one or more device epitaxial layers and vertically spaced apart from the diffusion barrier structure, the additional diffusion barrier structure comprising alternating layers of Si and oxygen-doped Si, wherein the gate is a planar gate insulated from a main surface of the one or more device epitaxial layers by a gate dielectric.

Separately or in combination, the method may further comprise forming the diffusion barrier structure at an angle with respect to the main surface of the doped Si base substrate.

Separately or in combination, forming the diffusion barrier structure at an angle with respect to the main surface of the doped Si base substrate may comprise forming the diffusion barrier structure on an undulated surface of an epitaxial layer.

Separately or in combination, forming the gate may comprise insulating a planar gate from a main surface of the one or more device epitaxial layers by a gate dielectric.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description which follows.

FIGS. 5A through 5D illustrate respective cross-sectional views of the semiconductor device during different stages of a process for forming one or more gaps in the diffusion barrier structure.

DETAILED DESCRIPTION

Embodiments described herein limit dopant out-diffusion from a highly doped Si base substrate of a power semiconductor device. The dopant out-diffusion is limited by a diffusion barrier structure comprising alternating layers of Si and oxygen-doped Si. The diffusion barrier structure may be formed in an upper part of the doped Si base substrate adjacent the main surface of the doped Si base substrate, in a lower part of one or more device epitaxial layers grown above the main surface of the doped Si base substrate, or in one or more additional epitaxial layers grown between the Si base substrate and the one or more device epitaxial layers. Additional diffusion barrier structures may be provided. Described next in more detail are embodiments of power semiconductor devices with such a diffusion barrier structure, and corresponding methods of manufacture.

Figure 1:
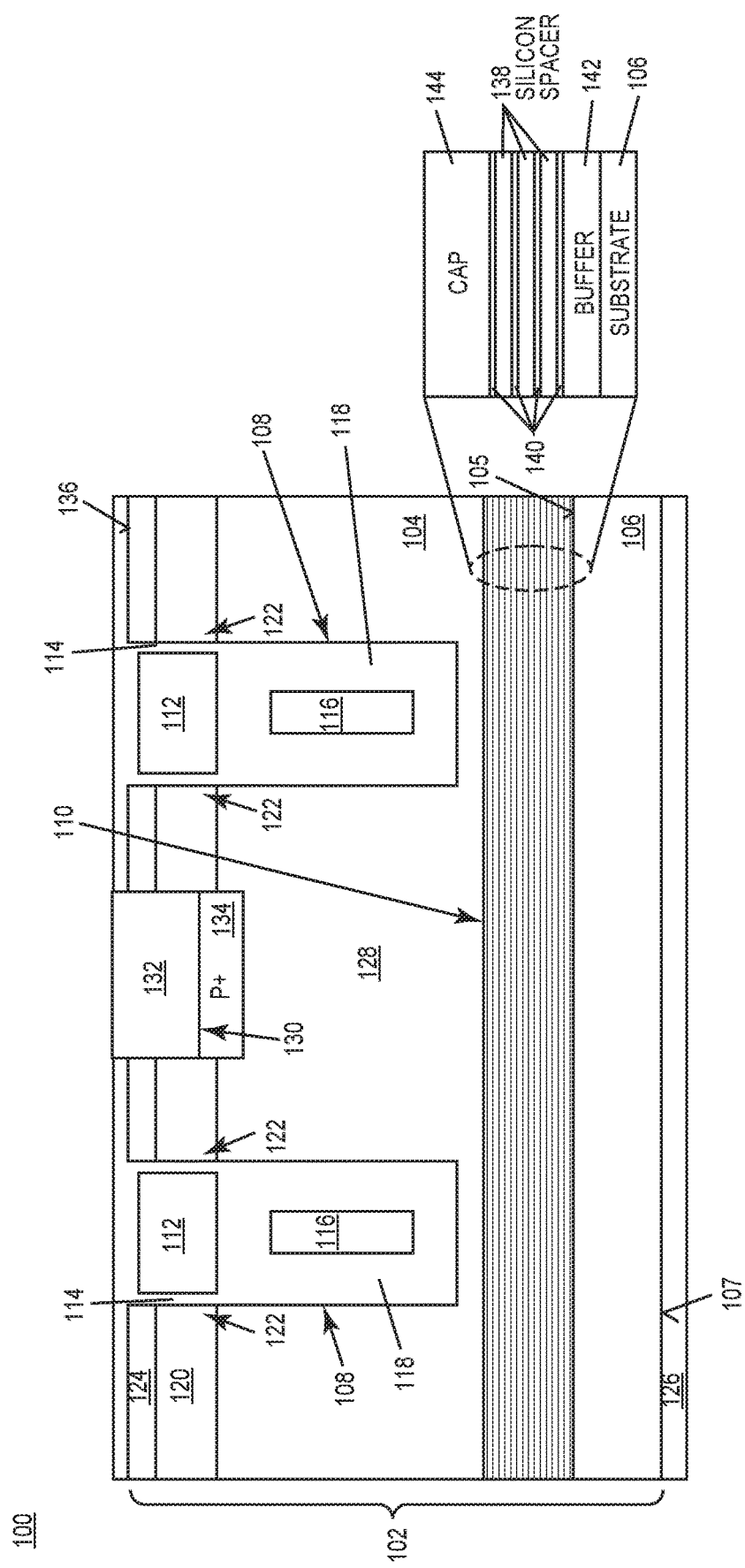
FIG. 1 illustrates a partial cross-sectional view of an embodiment of a semiconductor device having a diffusion barrier structure.

FIG. 1 illustrates a partial cross-sectional view of an embodiment of a power semiconductor device 100. The semiconductor device 100 includes a Si substrate 102 which has one or more device epitaxial layers 104 formed over a main surface 105 of a doped Si base substrate 106, and one or more gate trenches 108 extending into the Si substrate 102. The Si base substrate 106 may be doped n-type or p-type. For example, the Si base substrate 106 may be doped with boron (p-type), phosphorus (n-type), gallium (p-type), arsenic (n-type), etc. Particularly with respect to phosphorous and boron dopants, these dopants tend to diffuse at a high rate within a Si lattice. Out-diffusion of dopant atoms from the doped Si base substrate 106 into the one or more device epitaxial layers 104 can adversely affect device performance, e.g., by contributing to RonA/FOMg loss.

The semiconductor device 100 includes a diffusion barrier structure 110 for limiting the out-diffusion of dopant atoms from the doped Si base substrate 106 into the one or more device epitaxial layers 104, which will be described in more detail later herein.

The semiconductor device 100 also includes a gate electrode 112 disposed in each gate trench 108. The gate electrode 112 is insulated from the surrounding semiconductor material by a gate dielectric 114. A field electrode 116 may be disposed in each gate trench 108 below the corresponding gate electrode 112, and insulated from the surrounding semiconductor material and the gate electrode 112 by a field dielectric 118. The gate and field dielectrics 114, 118 may comprise the same or different materials, and may have the same or different thicknesses. The field electrode 116 instead may be formed in a different trench separate from the gate trench 108, or omitted altogether depending on the type of semiconductor device. The gate may be arranged in a trench 108 as shown in FIG. 1 to form a trench gate device, or the gate instead may be arranged above and insulated from the front main surface 136 of the Si substrate 102 to form a planar gate device as will be described in more detail later herein. The semiconductor device 100 may be a power semiconductor device such as a power MOSFET (metal-oxide-semiconductor field effect transistor), an IGBT (insulated gate bipolar transistor), etc.

The semiconductor device 100 further includes a body region 120 formed in the Si substrate 102. The body region 120 includes a channel region 122 which vertically extends along the sidewall of the corresponding gate trench 108. The diffusion barrier structure 110 may terminate before reaching the channel region 122.

The semiconductor device 100 also includes a source region 124 formed in the Si substrate 102 above the body region 120. Current flow through the channel region 122 is controlled by applying a gate potential to the gate electrode 112. A drain or collector region 126 is formed at the backside 107 of the base Si substrate 106. Depending on the type of device, additional structures may be formed in a drift zone 128 of the device 100 and/or between the drift zone 128 and the drain/collector region 126. For example, charge compensation structures (not shown) may be formed in the drift zone 128 and/or a field stop layer (not shown) may be formed between the drift zone 128 and the drain/collector region 126 in the case of an IGBT type device, Again, any type of semiconductor device with a trench or planar gate configuration may utilize the diffusion barrier teachings described herein.

The semiconductor device 100 also includes a contact trench 130 which extends into the Si substrate 102. The contact trench 130 is separated from each adjacent gate trench 108 by a portion of the source region 124 and a portion of the body region 120. The contact trench 130 is filled with an electrically conductive material 132 such as doped polysilicon, metal, etc. which contacts the source region 124 at the sidewall of the contact trench 130 and a highly doped (e.g. P+ in FIG. 1 for an n-channel device) body contact region 134 at the bottom of the contact trench 130. The electrically conductive material 132 which fills the contact trench 130 may extend onto the front main surface 136 of the Si substrate 102 and in a direction toward the gate trench 108.

The highly doped body contact region 134 at the bottom of the contact trench 130 has the same doping type as the body region 120, but at a higher concentration to provide good ohmic contact with the electrically conductive material 132 which fills the contact trench 130. For example, in the case of an n-channel device, the source region 124 and drift zone 128 are doped n-type and the body region 120, channel region 122 and highly doped body contact region 134 are doped p-type. Conversely, in the case of an p-channel device, the source region 124 and drift zone 128 are doped p-type and the body region 120, channel region 122 and highly doped body contact region 134 are doped n-type.

In either case, the diffusion barrier structure 110 extends over the main surface 105 of the doped Si base substrate 104. The diffusion barrier structure 110 comprises alternating layers of Si 138 and oxygen-doped Si 140. The alternating layers of Si 138 and oxygen-doped Si 140 form an oxygen-doped silicon region grown by epitaxy. In an embodiment, the oxygen concentration for each oxygen-doped Si layer 140 is below $5e14$ cm$^{-3}$. Each oxygen-doped Si layer 140 may have a thickness in the atomic range (e.g. one or several atoms thick) or in the nanometer range to ensure sufficient crystal information for growing Si on the oxygen-doped Si layers 140. The alternating layers of Si 138 and oxygen-doped Si 140 may be realized by epitaxially growing Si layers alternating with oxygen layers respectively adsorbed on surfaces of the Si layers, e.g., with a particular limited thickness for the oxygen-doped Si layers 140 to ensure adequate Si growth.

FIG. 1 provides an exploded view of the diffusion barrier structure 100, which may also include a Si buffer layer 142 formed below the alternating layers of Si 138 and oxygen-doped Si 140, and/or a capping layer 144 of Si epitaxially grown on the alternating layers of Si 138 and oxygen-doped Si 140. The Si buffer layer 142 may be relatively thin, e.g., in the range of 2-5 nm thick. The Si buffer layer 142 may be grown after an implant or an etch step. The capping layer 144 provides high carrier mobility in this region of the device 100. One or both of the buffer layer 142 and the capping layer 144 may be omitted. The oxygen-doped Si layers 140 of the diffusion barrier structure 110 limit out-diffusion of dopant atoms from the doped Si base substrate 106 into the drift zone 128 of the semiconductor device 100 formed in the one or more device epitaxial layers 104.

The oxygen-doped Si layers 140 of the diffusion barrier structure 110 may be formed by introducing oxygen partial monolayers to a Si lattice. The oxygen atoms are interstitially placed to minimize disruption to the Si lattice. Layers 138 of Si atoms separate adjacent oxygen partial monolayers 140. The alternating layers of Si 138 and oxygen-doped Si 140 may be formed by Si epitaxy with absorption of oxygen at different steps. For example, temperature and gaseous conditions can be controlled during the epitaxy process to form the partial oxygen monolayers 140. Oxygen may be introduced/incorporated between epitaxial layers 138 of Si, e.g. by controlling the introduction of an oxygen precursor into the epitaxy chamber. The resulting barrier structure 110 includes monolayers 140 that comprise mainly Si but have a doped level or concentration level of oxygen alternating with standard epitaxial layers 138 of Si without oxygen.

Figure 2:
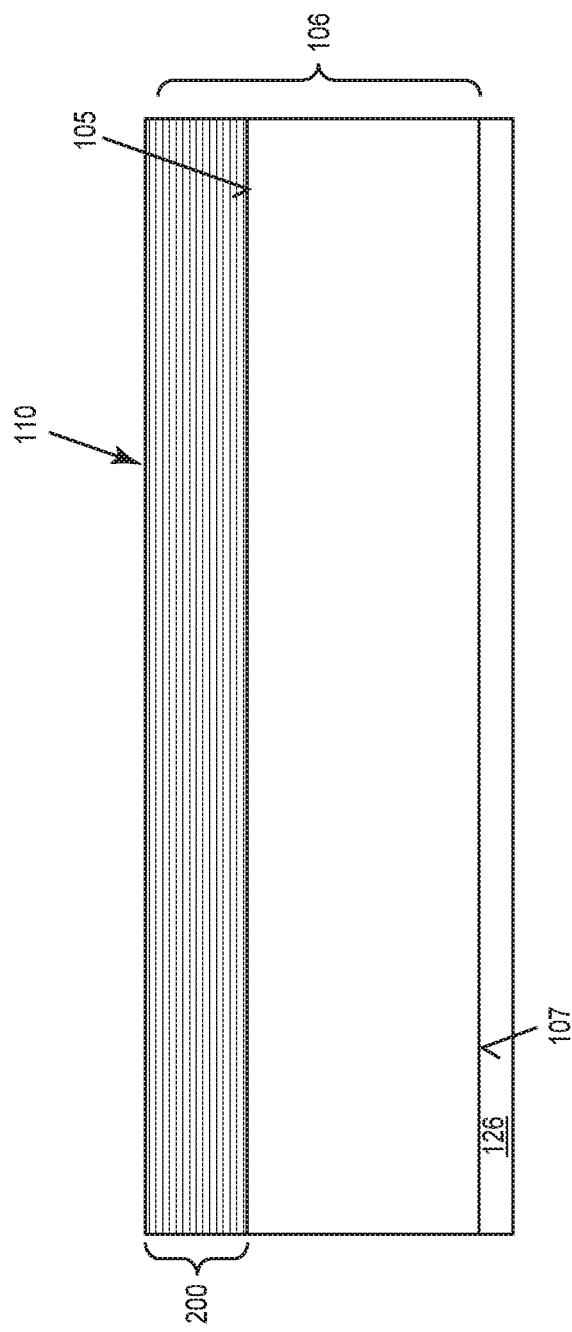
FIGS. 2 through 4 illustrate respective cross-sectional views of the diffusion barrier structure implemented in different regions of the semiconductor device.

FIG. 2 illustrates an embodiment in which the diffusion barrier structure 110 is formed in an upper part 200 of the doped Si base substrate 106 adjacent the main surface 105 of the doped Si base substrate 106. According to this embodiment, the diffusion barrier structure 100 is formed before the one or more device epitaxial layers 104. The buffer layer 142 and/or the capping layer 144 of the diffusion barrier structure 110 may be omitted in this case. The one or more device epitaxial layers 104 are formed above the diffusion barrier structure 110 according to this embodiment, and various device regions such as gate trenches 108, body region 120, source region 124, contact trench 130, etc. are then formed in the one or more device epitaxial layers 104 to yield the semiconductor device 100 shown in FIG. 1.

Figure 3:
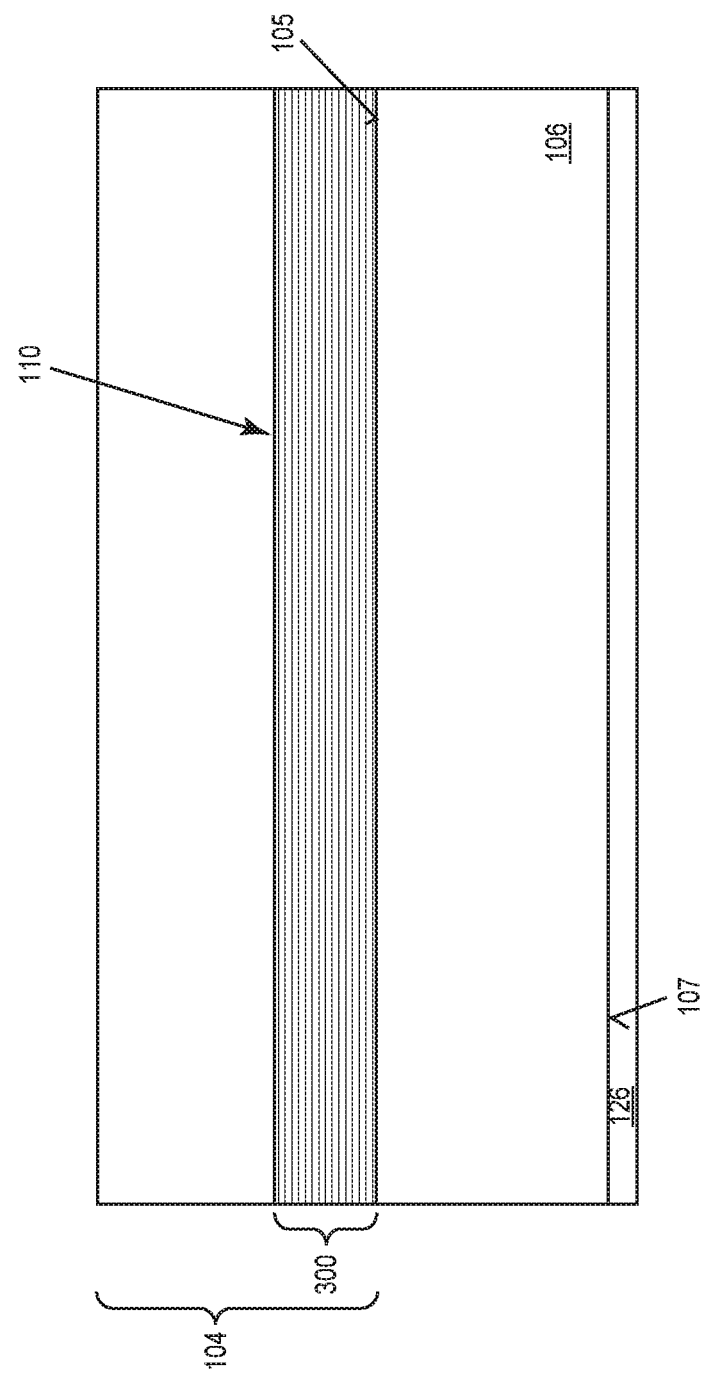

FIG. 3 illustrates an embodiment in which the one or more device epitaxial layers 104 are formed adjacent the main surface 105 of the doped Si base substrate 106 and the diffusion barrier structure 110 is formed in a lower part 300 of the one or more device epitaxial layers 104. According to this embodiment, the diffusion barrier structure 110 is formed as part of the device epitaxial layer formation process. The buffer layer 142 and/or the capping layer 144 of the diffusion barrier structure 110 may be omitted in this case. Various device regions such as gate trenches 108, body region 120, source region 124, contact trench 130, etc. are then formed in the one or more device epitaxial layers 104 to yield the semiconductor device 100 shown in FIG. 1.

Figure 4:
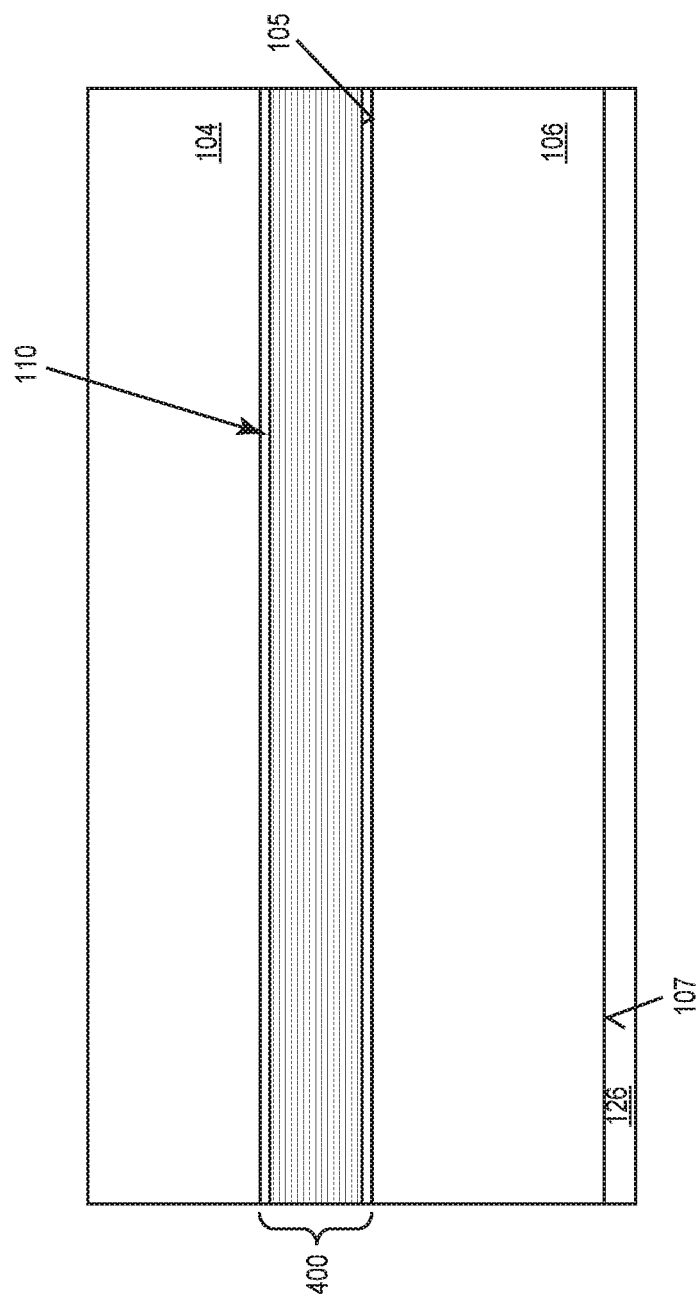

FIG. 4 illustrates an embodiment in which one or more additional (intermediary) epitaxial layers 400 are formed between the main surface 105 of the doped Si base substrate 106 and the one or more device epitaxial layers 104. According to this embodiment, the diffusion barrier structure 110 is formed in the one or more additional (intermediary) epitaxial layers 400. In other words, the diffusion barrier structure 110 is formed as part of the additional (intermediary) epitaxial layer formation process. The buffer layer 142 and/or the capping layer 144 of the diffusion barrier structure 110 may be omitted in this case. Various device regions such as gate trenches 108, body region 120, source region 124, contact trench 130, etc. are then formed in the one or more device epitaxial layers 104 to yield the semiconductor device 100 shown in FIG. 1.

FIGS. 5A through 5D illustrate respective cross-sectional views of the diffusion barrier structure 110 during different stages of a process for forming one or more gaps in the diffusion barrier structure 110. The gap(s) allow current to pass between the drift zone 128 and the doped Si base substrate 106 without traversing the diffusion barrier structure 110.

Figure 5A:
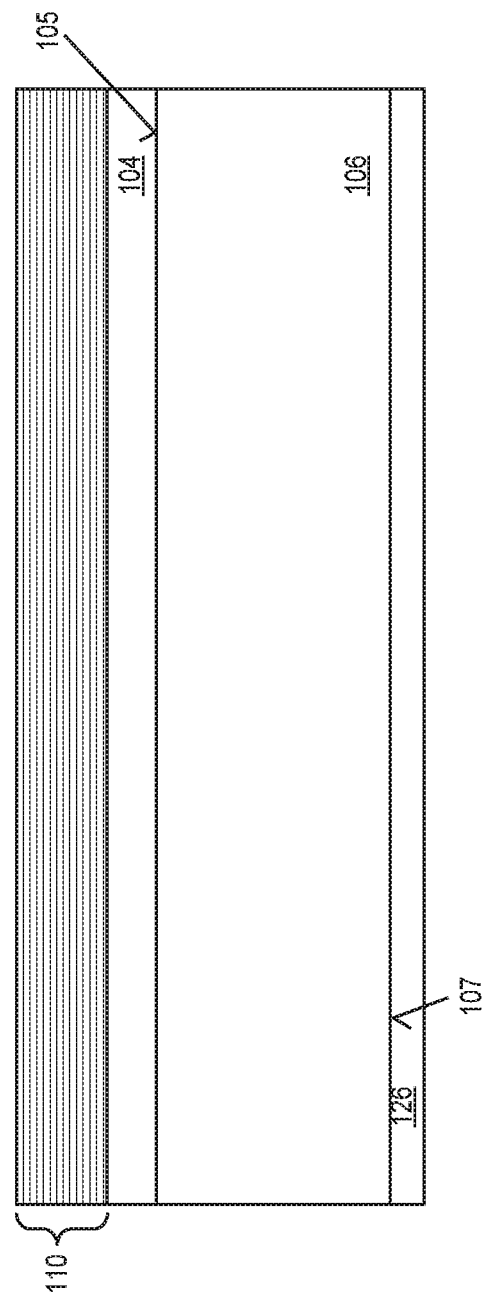

FIG. 5A shows the diffusion barrier structure 110 after formation. The diffusion barrier structure 110 is shown formed in the one or more device epitaxial layers 104, e.g., as shown in FIG. 3. However, the diffusion barrier structure 110 instead may be formed in an upper part of the doped Si base substrate 106 adjacent the main surface 105 of the doped Si base substrate 106 as shown in FIG. 2 or in one or more additional epitaxial layers 400 disposed between the main surface 105 of the doped Si base substrate 106 and the one or more device epitaxial layers 104 as shown in FIG. 4.

Figure 5B:
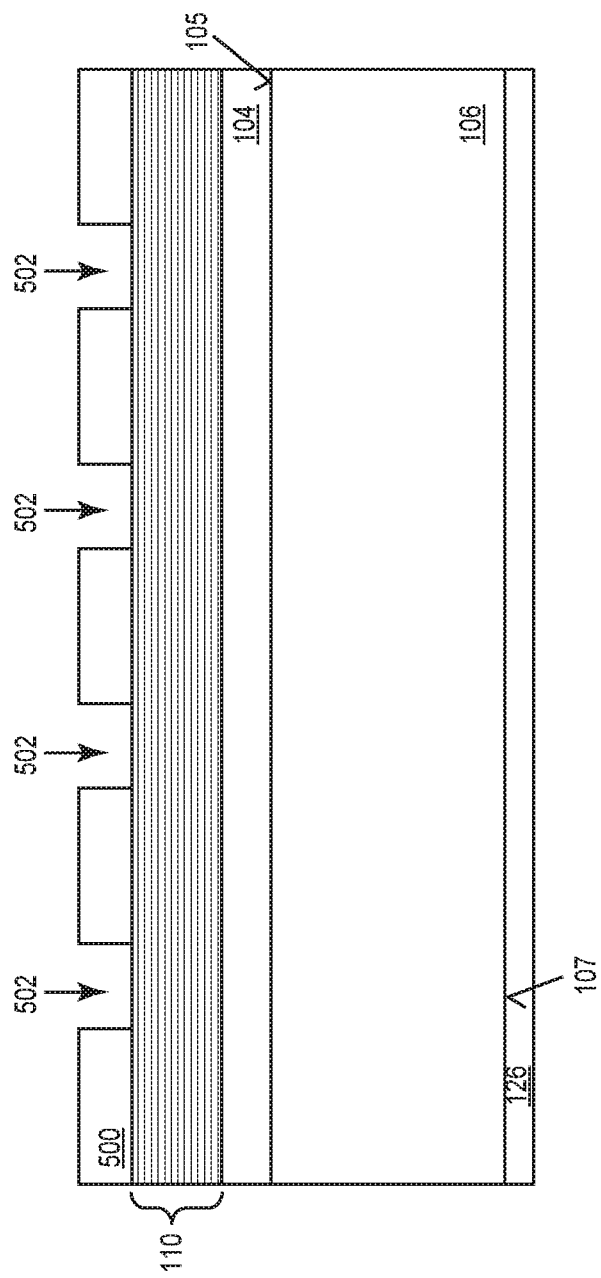

FIG. 5B shows a mask 500 such as a dielectric insulating layer with one or more openings 502 formed on the diffusion barrier structure 110. Any standard mask formation and patterning process may be used to form the mask 500 with openings 502. Part of the diffusion barrier structure 110 is exposed by the one or more openings 502 in the mask 500.

Figure 5C:
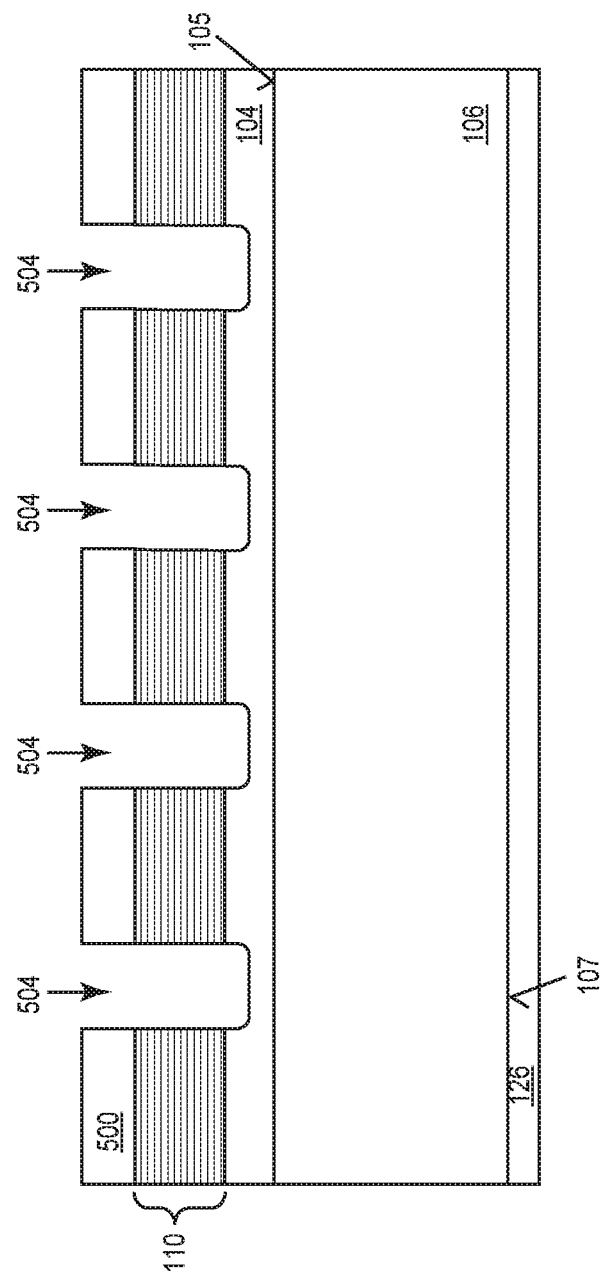

FIG. 5C shows a recess or trench 504 etched into the exposed part of the diffusion barrier structure 110 through each corresponding opening 502 in the mask 500 to form one or more gaps in the diffusion barrier structure 110. Any standard Si etching process may be used to form the gap(s) such as isotropic or anisotropic Si etching. The mask 500 may be subsequently removed.

FIG. 5D shows an epitaxial growth process which yields a generally planar epitaxial layer 506. The epitaxial sublayers 508 formed by the epitaxial growth process become more planar with increasing distance from the diffusion barrier structure 110. The sublayers 508 are illustrated with dashed lines in FIG. 5D to indicate that a plurality of sublayers may be grown to yield a generally planar epitaxial layer 506. Any standard epitaxial growth process may be used. Various device regions such as gate trenches 108, body region 120, source region 124, contact trench 130, etc. are then formed in the generally planar epitaxial layer 506 or in one or more epitaxial layers (not shown) grown over the generally planar epitaxial layer 506 to yield the semiconductor device 100 shown in FIG. 1. The surface need not be planarized by epitaxial growth. For example, depositing a thin capping layer in the trench may be sufficient to provide a conduction region around the diffusion barrier. In this case, further etching a trench into a planarized epitaxial layer may be skipped.

Figure 6:
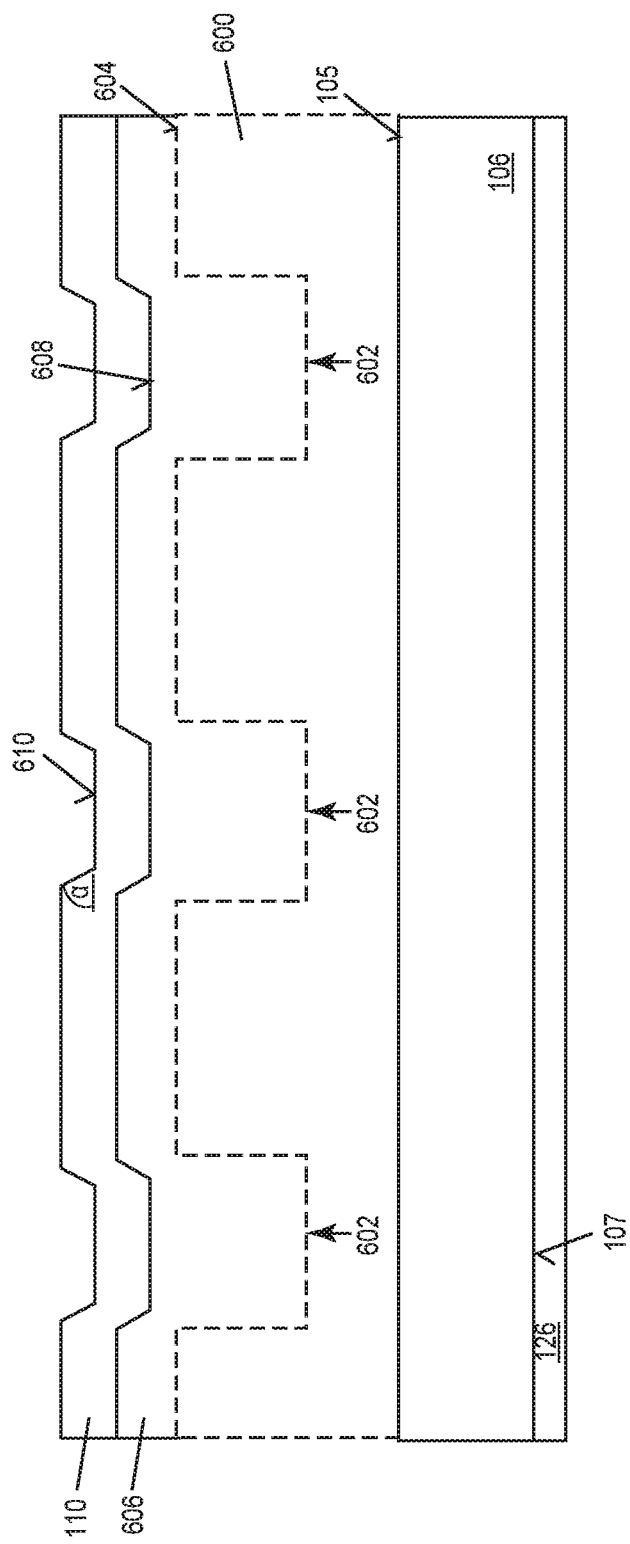
FIG. 6 illustrates a cross-sectional views of the semiconductor device during processing which forms the diffusion barrier structure at an angle (α) with respect to the main surface of the doped Si base substrate.

FIG. 6 illustrates a cross-sectional view during processing which forms the diffusion barrier structure 110 at an angle (α) with respect to the main surface 105 of the doped Si base substrate 106. The diffusion barrier structure 110 may be formed in an upper part of the doped Si base substrate 106 adjacent the main surface 105 as shown in FIG. 2, in a lower part of the one or more device epitaxial layers 104 adjacent the main surface 105 of the doped Si base substrate 106 as shown in FIG. 3, or in one or more additional epitaxial layers 400 disposed between the doped Si base substrate 106 and the one or more device epitaxial layers 104 as shown in FIG. 4.

In each case, Si material 600 below the diffusion barrier structure 110 is patterned to form recesses/trenches 602 in the top surface 604 of the material 600. The Si material 600 may be the doped Si base substrate 106 or an epitaxial layer grown above the doped Si base substrate 106. Hence, the Si material 600 is illustrated in dashed lines. A partial epitaxial growth process is then performed to form an epitaxial layer 606 having an undulated surface 608. The epitaxial growth process is terminated before the epitaxial layer 606 becomes generally planar. Any standard epitaxial growth process may be used to form the epitaxial layer 606 with the undulated surface 608. Alternatively, the recess/trench etch used to form the recesses/trenches 602 may be performed with a lattice orientation selective etch such as KOH which would provide a sloped sidewall after the etch with the correct crystal orientation for slip-free epitaxial growth. Over this etched structure the diffusion barrier would be directly grown with or without buffer and capping layers.

The diffusion barrier structure 110 is then formed on the undulated surface 608 of the underlying epitaxial layer 606. According to this embodiment, the diffusion barrier structure 110 has an undulated surface 610 with sidewalls that are at an angle (α) with respect to the main surface 105 of the doped Si base substrate 106. Various device regions such as gate trenches 108, body region 120, source region 122, contact trench 130, etc. are then formed in one or more device epitaxial layers 104 grown above the diffusion barrier structure 110 to yield the semiconductor device 100 shown in FIG. 1.

Figure 7A:
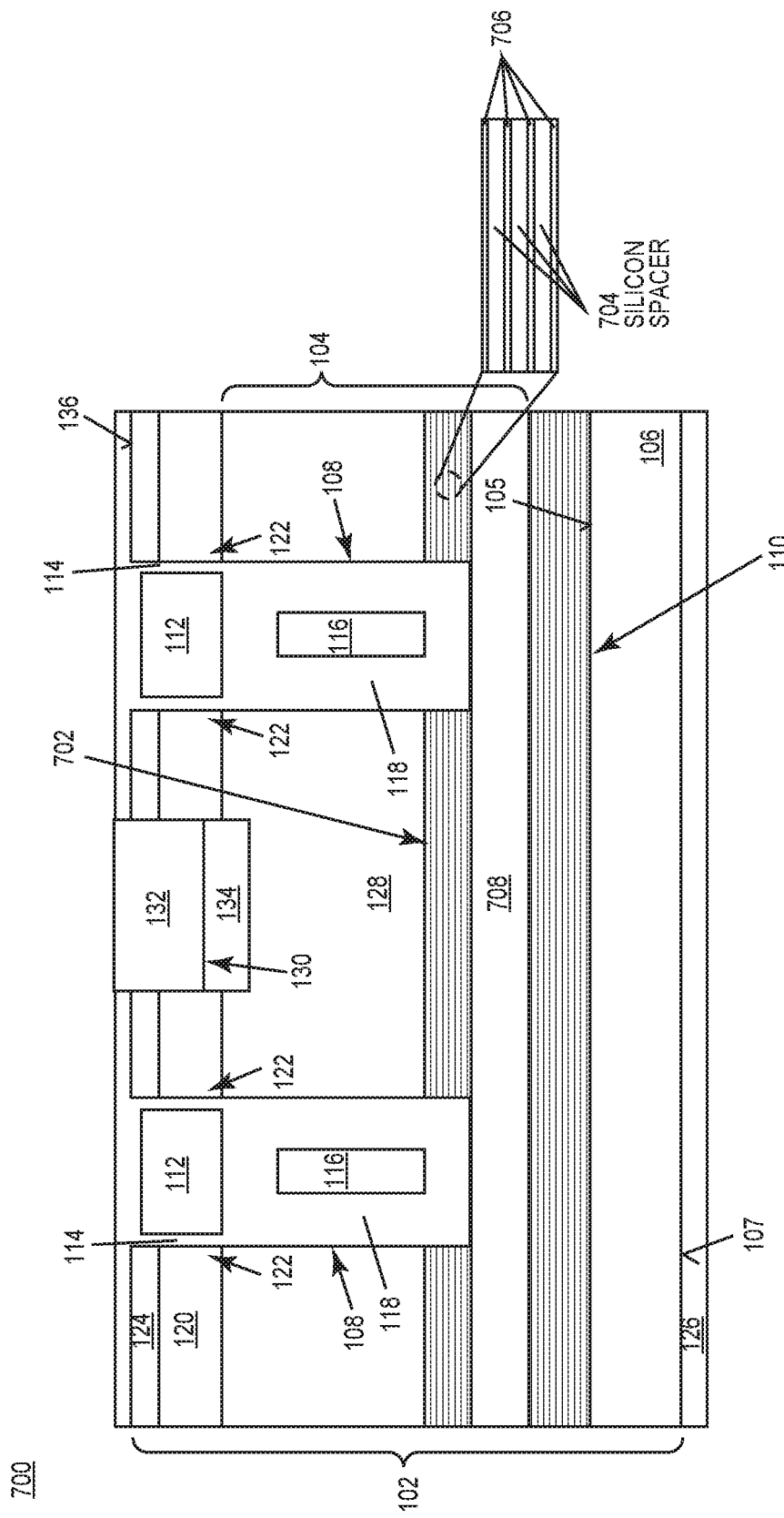
FIG. 7A illustrates a partial cross-sectional view of another embodiment of a semiconductor device having a diffusion barrier structure.

FIG. 7A illustrates a partial cross-sectional view of another embodiment of a semiconductor device 700 having the diffusion barrier structure 110. The embodiment shown in FIG. 7A is similar to the embodiment shown in FIG. 1. Different, however, an additional diffusion barrier structure 702 is formed in the one or more device epitaxial layers 104. The additional diffusion barrier structure 702 is vertically spaced apart from the lower diffusion barrier structure 110 and comprises alternating layers of Si 704 and oxygen-doped Si 706. FIG. 7A provides an exploded view of the additional diffusion barrier structure 702, which may also include a Si buffer layer (not shown) formed below the alternating layers of Si 704 and oxygen-doped Si 706, and/or a capping layer (not shown) of Si epitaxially grown on the alternating layers of Si 704 and oxygen-doped Si 706, e.g., similar to what is shown in FIG. 1 for the lower diffusion barrier structure 110. One or both of the buffer layer and the capping layer may be omitted.

The alternating layers of Si 704 and oxygen-doped Si 706 of the additional diffusion barrier structure 702 may be formed as previously described herein in connection with the lower diffusion barrier structure 110. The diffusion barrier structures 110, 702 collectively contain dopant atoms in a region 708 of the one or more device epitaxial layers 104 disposed between the diffusion barrier structures 110, 702. In one embodiment, the additional diffusion barrier structure 702 abuts the sidewall of each gate trench 108 as shown in FIG. 7A. Separately or in combination, the additional diffusion barrier structure 702 may terminate before reaching the channel region 122 and/or the highly doped body contact region 134 of the semiconductor device 700.

The lower diffusion barrier structure 110 and the additional diffusion barrier structure 702 may have one or more gaps so that current can pass between the channel region 122 and the doped Si base substrate 106 through the gap(s) without traversing either diffusion barrier structure 110, 702. The gap(s) may be formed as previously described herein in connection with FIGS. 5A through 5D. That is, the processing described in connection with FIGS. 5A through 5B may be applied to the additional diffusion barrier structure 702 to form one or more gaps which allow current to pass between the channel region 122 and the doped Si base substrate 106 without traversing the additional diffusion barrier structure 702.

Separately or in combination, the lower diffusion barrier structure 110 and/or of the additional diffusion barrier structure 702 may be formed at an angle (α) with respect to the main surface 105 of the doped Si base substrate 106 as previously described herein in connection with FIG. 6. That is, the processing described in connection with FIG. 6 may be applied to the additional diffusion barrier structure 702 so that the additional diffusion barrier structure 702 has an undulated surface with sidewalls that are at an angle (α) with respect to the main surface 105 of the doped Si base substrate 106.

Figure 7B:
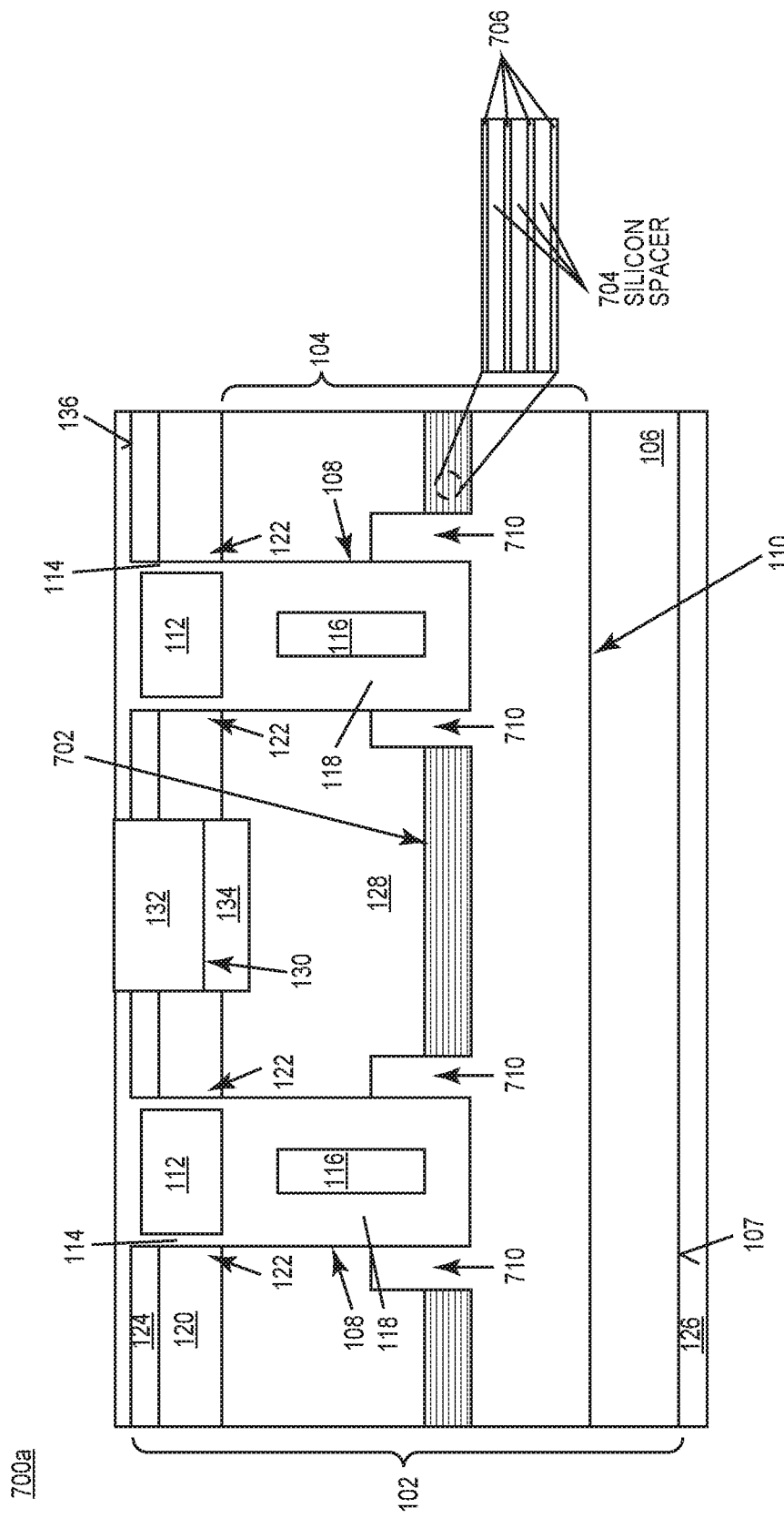
FIG. 7B illustrates a partial cross-sectional view of another embodiment of a semiconductor device having a diffusion barrier structure.
Figure 8:
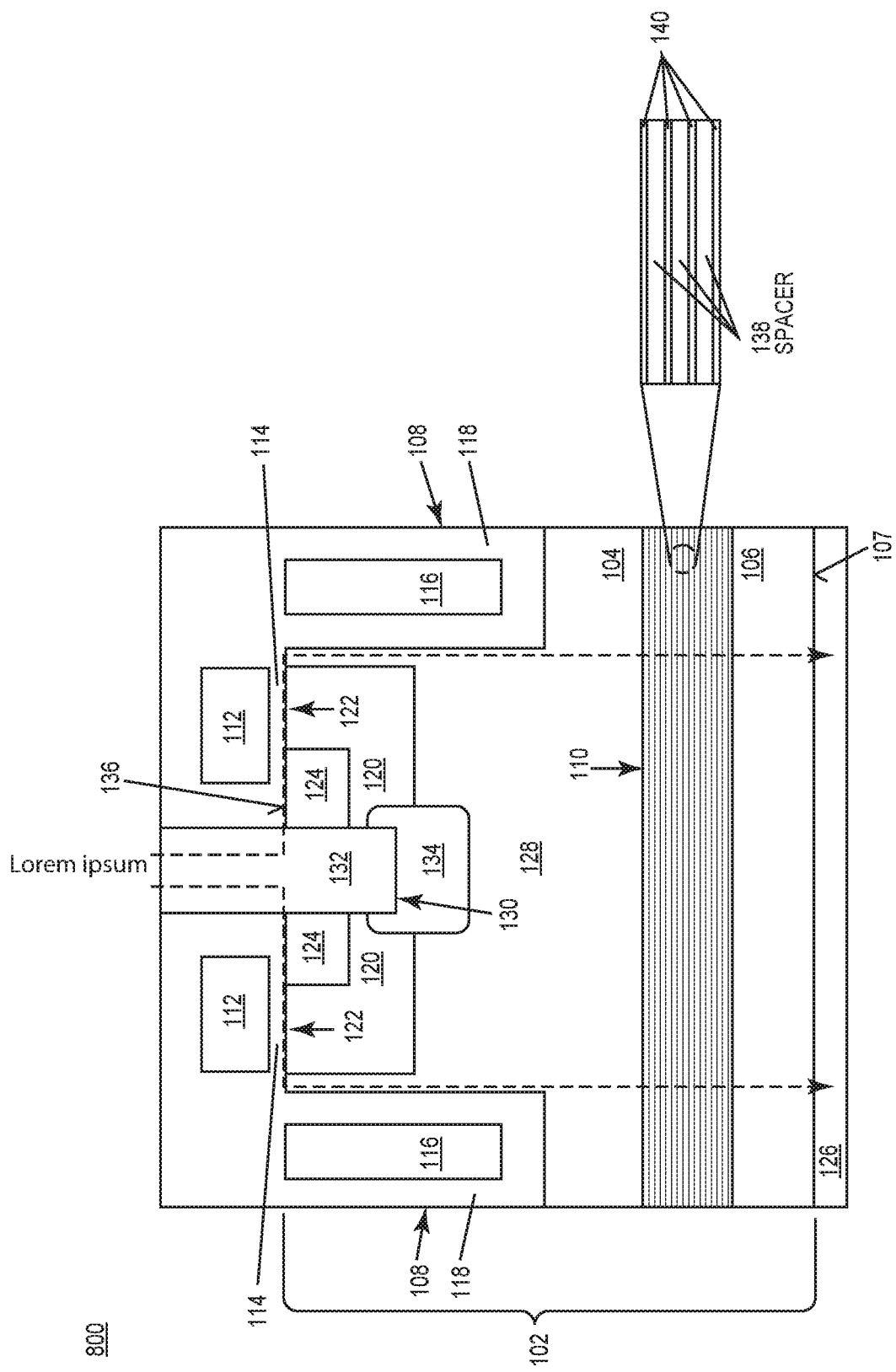
FIG. 8 illustrates a partial cross-sectional view of an embodiment of a planar gate device having a diffusion barrier structure.

FIG. 7B illustrates a partial cross-sectional view of another embodiment of a semiconductor device 700a having the upper diffusion barrier structure 702. The embodiment shown in FIG. 8 is similar to the embodiment shown in FIG. 1. Different, however, the upper diffusion barrier structure 702 has a gap 710 along a lower part of the gate trenches 108 which contains the field electrodes 116. As such, the upper diffusion barrier structure 702 has a gap 710 in the drift zone 128 of the device. The lower diffusion barrier structure 110 may be omitted in this embodiment.

FIG. 8 illustrates a partial cross-sectional view of another embodiment of a semiconductor device 800 having the diffusion barrier structure 110. The embodiment shown in FIG. 8 is similar to the embodiment shown in FIG. 1. Different, however, the gate electrode 112 is arranged above and insulated from the front main surface 136 of the Si substrate 102 by the gate dielectric 114 to form a planar gate device 800. The current path of the planar gate device is illustrated with dashed lines. The planar gate device 800 may also include an additional diffusion barrier structure formed in the one or more device epitaxial layers 104, e.g., as shown in FIG. 7A. The field electrodes 116 may be omitted, as previously described herein.

Figure 9:
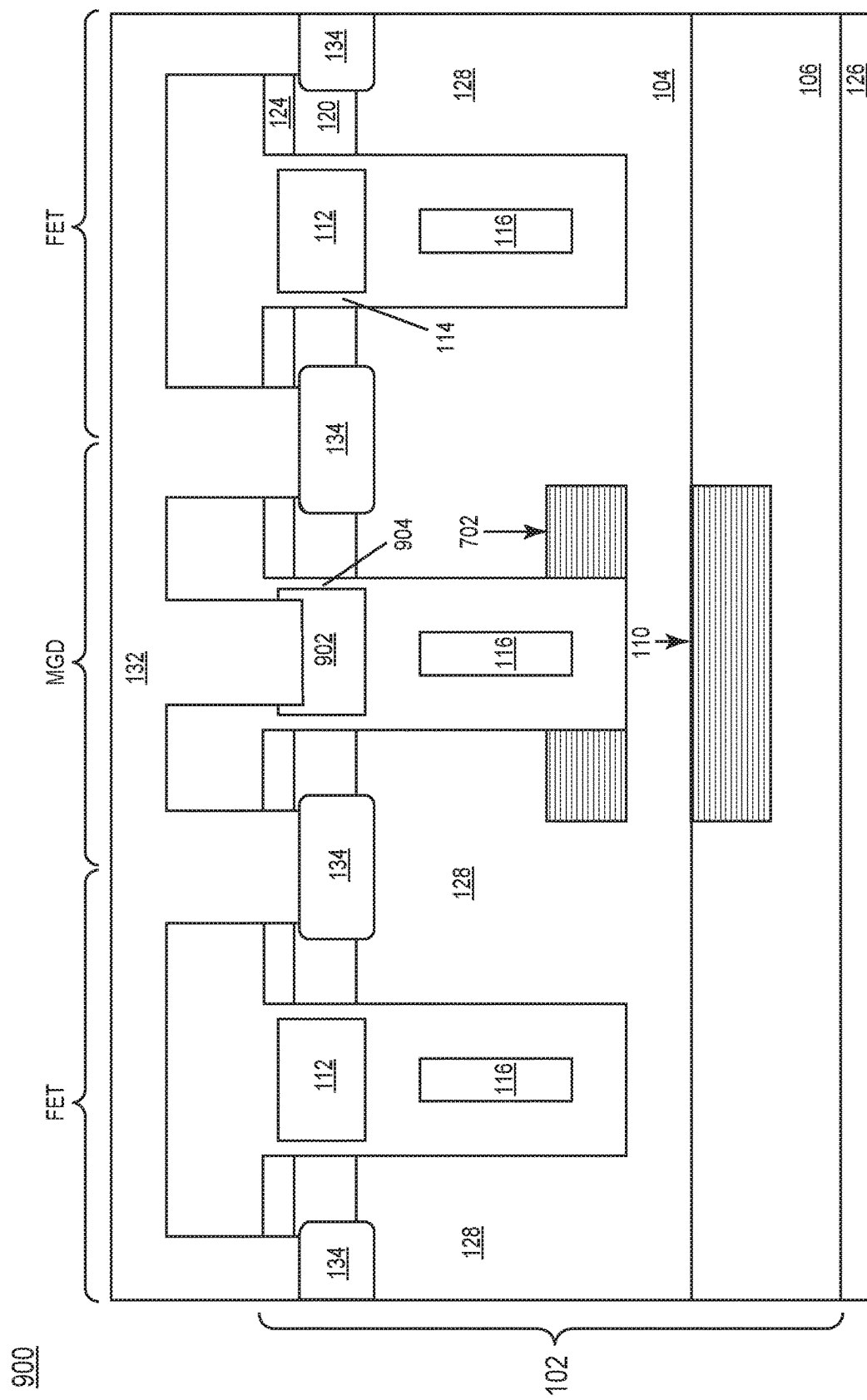
FIG. 9 illustrates a partial cross-sectional view of an embodiment of a semiconductor device having a diffusion barrier structure and a MOS-gated diode (MGD).

FIG. 9 illustrates a partial cross-sectional view of another embodiment of a semiconductor device 900 having the diffusion barrier structure 110. The embodiment shown in FIG. 9 is similar to the embodiment shown in FIGS. 7A and 7B. Different, however, the middle cell shown in FIG. 9 is a MOS-gated diode (MGD). One structural characteristic of a MGD is an MGD gate 902 connected to source potential. For example, the MGD gate 902 may be short-circuited to the source region 124 of the neighboring FETs via electrically conductive material 132. The MGD gate 902 generates a conducting channel in the body region 120 between the underlying drift zone 128 and the source region 124 each time the electrical potential of the drift zone 128 is more than the threshold voltage of the MGD above the electrical potential of the source and body regions 120, 120. The diffusion barrier structures 110, 702 may be limited to the MGD region to reduce dopant out-diffusion in the MGD region of the device 900, as shown in FIG. 9. With this approach, performance of the FET and MGD regions may be tuned independently (e.g. less tail doping in the MGD region compared to the FET region). Alternatively, the diffusion barrier structures 110, 702 may be present in both the FET and MGD regions of the device 900. The MGD may have a thinner dielectric 904 insulating the MGD gate 902 than the gate dielectric 114.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a semiconductor device, the method comprising:
    forming one or more device epitaxial layers over a main surface of a doped Si base substrate;
    forming a diffusion barrier structure comprising alternating layers of Si and oxygen-doped Si in an upper part of the doped Si base substrate adjacent the main surface of the doped Si base substrate, in a lower part of the one or more device epitaxial layers adjacent the main surface of the doped Si base substrate, or in one or more additional epitaxial layers disposed between the main surface of the doped Si base substrate and the one or more device epitaxial layers; and
    forming a gate above the diffusion barrier structure.

2. The method of claim 1, wherein forming the diffusion barrier structure comprises:
    forming the alternating layers of Si and oxygen-doped Si in the upper part of the doped Si base substrate adjacent the main surface of the doped Si base substrate.

3. The method of claim 1, wherein forming the diffusion barrier structure comprises:
    forming the alternating layers of Si and oxygen-doped Si in the lower part of the one or more device epitaxial layers adjacent the main surface of the doped Si base substrate.

4. The method of claim 1, wherein forming the diffusion barrier structure comprises:
    forming the alternating layers of Si and oxygen-doped Si in the one or more additional epitaxial layers disposed between the main surface of the doped Si base substrate and the one or more device epitaxial layers.

5. The method of claim 1, further comprising:
    forming one or more gaps in the diffusion barrier structure.

6. The method of claim 5, wherein forming the one or more gaps in the diffusion barrier structure comprises:
    forming a mask with one or more openings on the diffusion barrier structure; and
    etching the one or more gaps into the diffusion barrier structure through the one or more openings in the mask.

7. The method of claim 1, further comprising:
    forming an additional diffusion barrier structure in the one or more device epitaxial layers and vertically spaced apart from the diffusion barrier structure, the additional diffusion barrier structure comprising alternating layers of Si and oxygen-doped Si.

8. The method of claim 7, further comprising:

forming one or more gaps in the diffusion barrier structure and the additional diffusion barrier structure.

9. The method of claim 1, further comprising:

forming a drift zone formed in the one or more device epitaxial layers;

forming a body region in the one or more device epitaxial layers above the drift zone and including a channel region;

forming a source region in the one or more device epitaxial layers above the body region; and forming a contact trench in the one or more device epitaxial layers, the contact trench being filled with an electrically conductive material which contacts the source region at a sidewall of the contact trench and a highly doped body contact region at a bottom of the contact trench, wherein the diffusion barrier structure has a gap in the drift zone.

10. The method of claim 9, further comprising:

forming an additional diffusion barrier structure in the one or more device epitaxial layers and vertically spaced apart from the diffusion barrier structure, the additional diffusion barrier structure comprising alternating layers of Si and oxygen-doped Si, wherein the gate is disposed in a gate trench formed above the diffusion barrier structure in the one or more device epitaxial layers and extending in a direction toward the main surface of the doped Si base substrate.

11. The method of claim 1, further comprising:

forming the diffusion barrier structure at an angle with respect to the main surface of the doped Si base substrate.

12. The method of claim 11, wherein forming the diffusion barrier structure at the angle with respect to the main surface of the doped Si base substrate comprises:

forming the diffusion barrier structure on an undulated surface of an epitaxial layer.

13. The method of claim 1, wherein forming the gate comprises:

insulating a planar gate from a main surface of the one or more device epitaxial layers by a gate dielectric.

14. The method of claim 1, wherein forming the diffusion barrier structure comprises:

forming a Si buffer layer below the alternating layers of Si and oxygen-doped Si.

15. The method of claim 1, wherein forming the diffusion barrier structure comprises:

forming a capping layer of Si on the alternating layers of Si and oxygen-doped Si.

16. The method of claim 1, wherein forming the diffusion barrier structure comprises:

forming a Si buffer layer below the alternating layers of Si and oxygen-doped Si; and forming a capping layer of Si on the alternating layers of Si and oxygen-doped Si.

17. The method of claim 1, wherein the alternating layers of Si and oxygen-doped Si are formed by Si epitaxy with absorption of oxygen at different steps.

18. The method of claim 17, further comprising:

controlling temperature and gaseous conditions during the Si epitaxy to form partial oxygen monolayers as the layers of oxygen-doped Si.

19. The method of claim 1, further comprising:

etching a plurality of trenches into the diffusion barrier structure.

20. The method of claim 19, further comprising:

forming a lateral gap between the trenches and the diffusion barrier structure such that the diffusion barrier structure is laterally spaced apart from the trenches.

* * * * *